(12) United States Patent
Mikolajick et al.

(10) Patent No.: US 7,049,651 B2
(45) Date of Patent: May 23, 2006

(54) CHARGE-TRAPPING MEMORY DEVICE INCLUDING HIGH PERMITTIVITY STRIPS

(75) Inventors: Thomas Mikolajick, Dresden (DE); Hans Reisinger, Grunwald (DE); Josef Willer, Riemerling (DE); Corvin Liaw, München (DE)

(73) Assignee: Infineon Technologies AG, Munich (DE)

( * ) Notice: Subject to any disclaimer, the term of this patent is extended or adjusted under 35 U.S.C. 154(b) by 85 days.

(21) Appl. No.: 10/715,142

(22) Filed: Nov. 17, 2003

(65) Prior Publication Data

US 2005/0104117 A1 May 19, 2005

(51) Int. Cl.
*H01L 29/788* (2006.01)
(52) U.S. Cl. .............. 257/315; 257/314; 257/316; 257/320; 257/321; 257/322; 257/326
(58) Field of Classification Search ......... 257/239, 257/261, 295, 298, 310, 314–326; 438/201, 438/211, 216, 241, 257, 258, 260–266, 591, 438/593
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 6,324,099 B1 | 11/2001 | Iijima | |
| 6,335,554 B1 * | 1/2002 | Yoshikawa | 257/316 |
| 6,639,271 B1 | 10/2003 | Zheng et al. | |
| 6,673,677 B1 | 1/2004 | Hofmann et al. | |
| 2003/0080372 A1 | 5/2003 | Mikolajick | |
| 2003/0134475 A1 | 7/2003 | Hofmann et al. | |
| 2003/0148582 A1 | 8/2003 | Willer et al. | |
| 2003/0161192 A1 | 8/2003 | Kobayashi et al. | |
| 2003/0185055 A1 | 10/2003 | Yeh et al. | |
| 2004/0097037 A1 | 5/2004 | Hofmann et al. | |

FOREIGN PATENT DOCUMENTS

| | | |
|---|---|---|
| DE | 10144700 A1 | 4/2002 |
| DE | 10036911 C2 | 6/2002 |
| EP | 1103980 A2 | 5/2001 |
| WO | WO 02/11145 A2 | 2/2002 |

OTHER PUBLICATIONS

Yeh, C.C., et al., "PHINES: A Novel Low Power Program/Erase, Small Pitch, 2-Bit per Cell Flash Memory," IEEE, 2002.

* cited by examiner

*Primary Examiner*—Andy Huynh
(74) *Attorney, Agent, or Firm*—Slater & Matsil, L.L.P.

(57) ABSTRACT

The charge-trapping layer comprises two strips above the source and drain junctions. The thicknesses of the charge-trapping layer and the gate dielectric are chosen to facilitate Fowler-Nordheim-tunnelling of electrons into the strips during an erasure process. Programming is performed by injection of hot holes into the strips individually for two-bit storage.

10 Claims, 15 Drawing Sheets

PRIOR ART

Vs=0 V  Vd=1.6 V

Vs=0 V  Vd=1.6 V

Vs=0 V  Vd=1.6 V

Vs=0 V  Vd=1.6 V

FIG 7
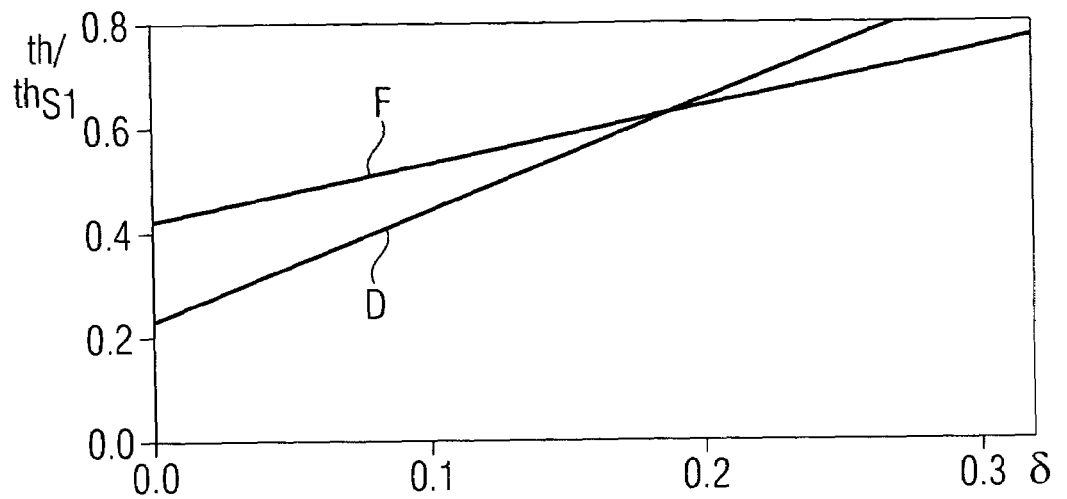
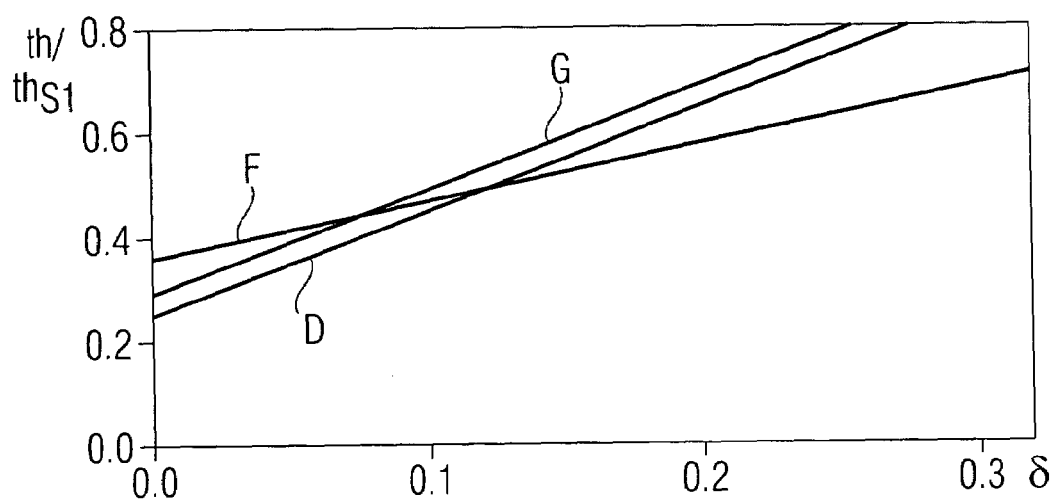
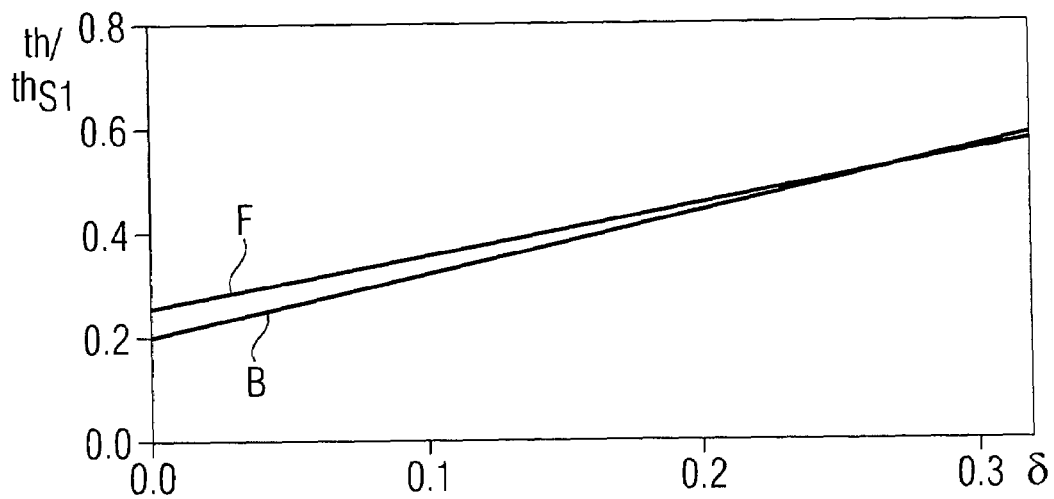

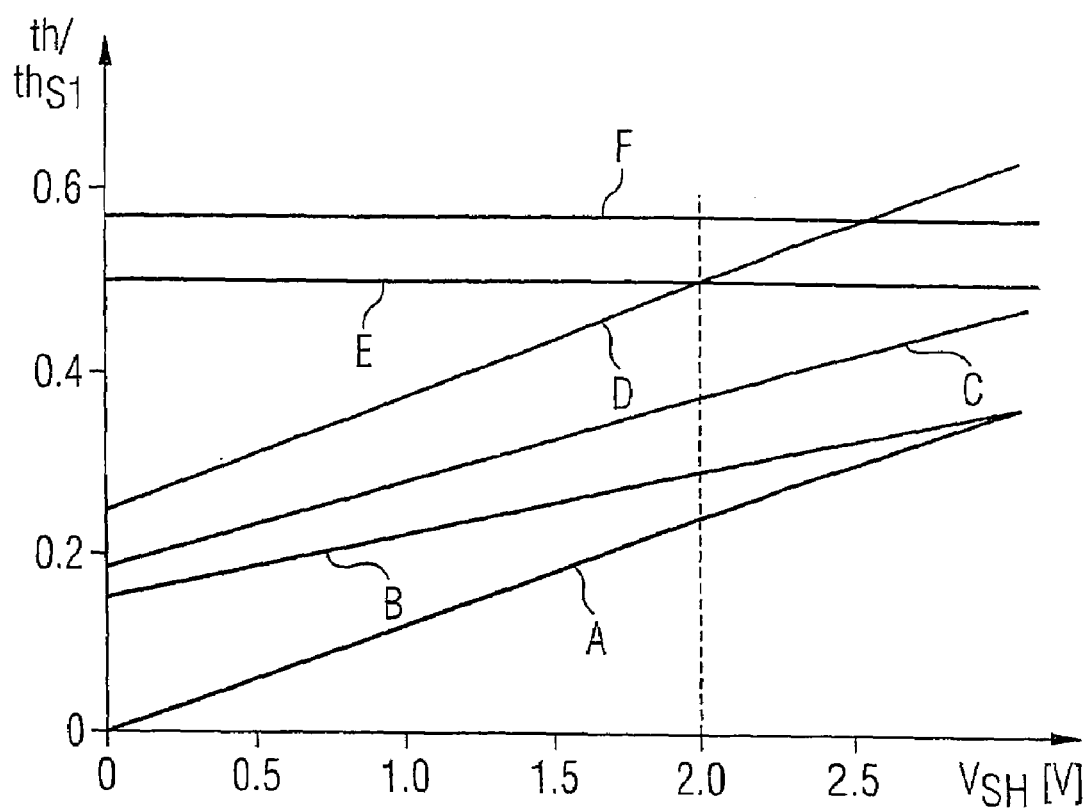

US 7,049,651 B2

CHARGE-TRAPPING MEMORY DEVICE INCLUDING HIGH PERMITTIVITY STRIPS

TECHNICAL FIELD

The invention generally relates to semiconductor memory devices and more particularly to charge-trapping memory devices.

BACKGROUND

Memory devices with charge-trapping layers, especially SONOS memory cells comprising oxide-nitride-oxide layer sequences as storage medium, are usually programmed by channel hot electron injection. U.S. Pat. No. 5,768,192 and U.S. Pat. No. 6,011,725 disclose charge-trapping memory cells of a special type of so-called NROM cells, which can be used to store bits of information both at the source and at the drain below the respective gate edges. The programmed cell is read in reverse mode to achieve a sufficient two-bit separation. Erasure is performed by hot hole injection. The current consumption of each cell during programming with fully driven transistor is about 100 µA. An increment of charges towards the middle channel region significantly reduces the number of possible programming cycles. Therefore, it is not possible to shrink the cell to the sub-100-nm technology since the increasing amount of charges in the middle channel region cannot be completely neutralized during the reprogramming process. Thus, the performance of the memory cell will deteriorate with an increasing number of programming cycles.

US 2003/0185055 A1 and a corresponding paper of C. C. Yeh et al., "PHINES: A Novel Low Power Program/Erase, Small Pitch, 2-Bit per Cell Flash Memory", 2002 IEEE, disclosed a non-volatile semiconductor memory cell with electron-trapping erase state, which is operated as flash memory and is able to store two bits. The erasure takes place by Fowler-Nordheim tunneling of electrons from either channel or gate electrode into the storage layer of a conventional charge-trapping layer sequence, for example an ONO layer sequence. In programming this memory, electric holes are injected into the non-conducting charge-trapping layer. Hot hole injection can be induced at source and drain, which means, at both ends of the channel. This operating method avoids high programming currents. The difficulty to neutralize charges trapped above the middle channel region results in a small programming window in different programming states within the same cell of less than about 1.5 V. This again is not advantageous for scalability.

SUMMARY OF THE INVENTION

An inventive charge-trapping memory device comprises a charge-trapping layer formed by two strips of dielectric material, which are located between the gate electrode and upper boundaries of the source and drain junctions. The source and drain junctions are the boundaries of the doped regions forming source and drain within the semiconductor material of the substrate. The upper boundaries of the junctions, which adjoin the upper surface of the semiconductor body, delimitate the length of the channel. Between parts of the source, drain and channel regions and the lower edges of the gate electrode, thin, small strips of the storage material are located and enclosed within the gate dielectric. The thicknesses of the gate dielectric and the charge-trapping strips are chosen to facilitate electron tunneling primarily into the charge-trapping layer during erasure. In this operating mode, a positive voltage is applied to the gate electrode. This voltage generates an electric potential difference across the gate dielectric and an inversion layer in the semiconductor interface.

The thicknesses of the gate dielectric and the charge trapping strips are adapted so that the electric field strength in the area of single gate dielectric is in every stage of the erasing process smaller than or at most equal to the value of the electric field strength in the bottom oxide film within the area of the charge-trapping layer. If the gate dielectric is an oxide, for instance silicon dioxide, the thickness of the charge-trapping layer is best evaluated in terms of an equivalent oxide thickness, which depends on the material of the charge-trapping layer, for instance silicon nitride. The charge-trapping layer can also be an oxide or silicate comprising Ta, Hf, La, Zr, Ti, Nb, Cr, V, Y, Ce and/or Pr.

In the case of silicon nitride, the equivalent oxide thickness due to the value of the relative permittivity or relative dielectric constant, is about half as much as the real physical thickness. A nitride layer, which is, for example, 10 nm thick is equivalent to a silicon dioxide layer, which is about 5 nm thick. The electric field strength is the derivative of the voltage along the selected paths. This value has to be maintained larger across the charge-trapping strips than across the single gate dielectric above the middle channel region. In this way, the amount of charge injected in the single gate dielectric above the middle channel region can be reduced considerably. This results in less degradation, better reliability and a better behavior of the device during the programming cycles, which increases the cycling endurance significantly. Data retention after cycling is improved as well. Low power consumption and improved two bit separation are obtained, while the cell is shrinkable to dimensions of about 100 nm gate length.

One advantage of the preferred embodiment of the present invention is that it provides a charge-trapping flash memory device with low power consumption, good shrinkability, and high endurance for large numbers of programming cycles.

Aspects of the present invention also provide an operating method, which is especially adapted to the flash memory device. The preferred embodiment also provides manufacturing methods for an inventive flash memory device.

BRIEF DESCRIPTION OF THE DRAWINGS

Preferred and other embodiments and examples of the invention are further described in detail below in conjunction with the accompanying drawings, in which:

FIGS. 7a–7c (collectively FIG. 7) show diagrams of the ratio of layer thicknesses as function of a threshold voltage shift;

FIG. 23 shows a diagram of the ratio of layer thicknesses as function of a threshold voltage shift.

DETAILED DESCRIPTION OF ILLUSTRATIVE EMBODIMENTS

Figure 1:
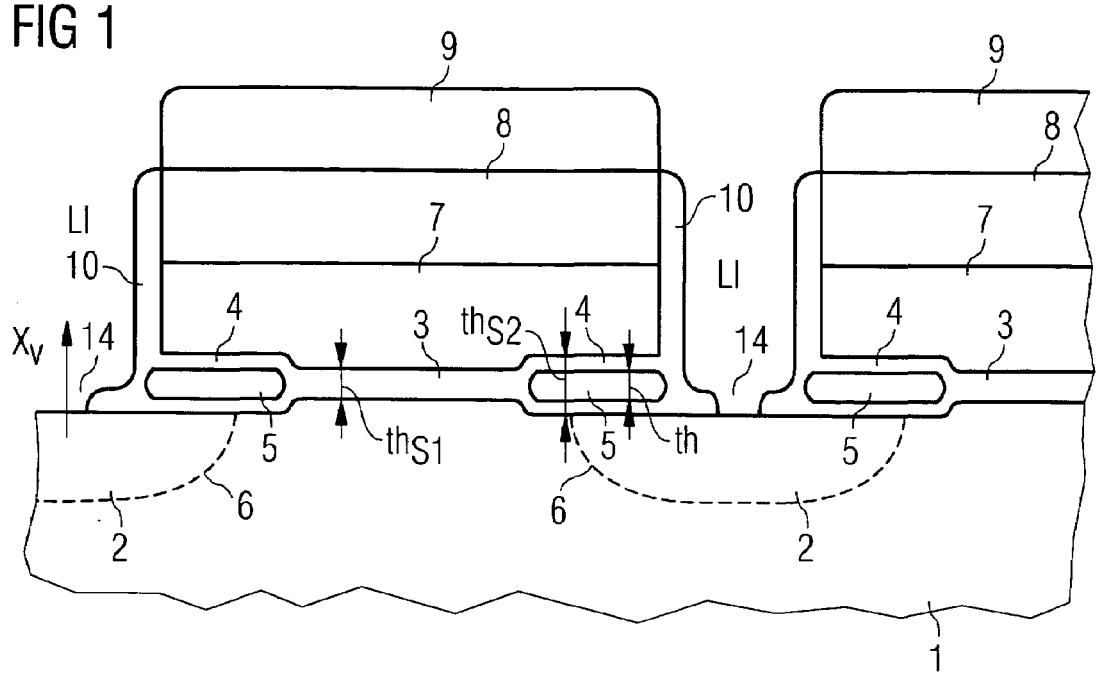
FIG. 1 is a cross-section of the charge-trapping memory device.

FIG. 1 shows a cross-section of a preferred embodiment of the memory device. In a semiconductor body 1 or substrate, preferably p-doped, source and drain regions 2 are formed by doped regions, preferably $n^+$-doped. A gate dielectric 3 is arranged on an upper surface of said semiconductor body 1. The gate dielectric 3 is a single layer above a middle section of a channel region located between source and drain regions of the same memory cell. At both ends of the channel, the gate dielectric is structured as a charge-trapping layer sequence 4 comprising a charge-trapping layer 5 formed by two strips 5 of a material having a higher relative permittivity or relative dielectric constant than the material of the gate dielectric 3. For example, if the gate dielectric is silicon dioxide, the material of the charge-trapping layer 5 can be silicon nitride. The strips of the charge-trapping layer 5 are located above upper boundaries of junctions 6 that are designated by dotted lines in FIG. 1. These junctions 6 are the boundaries between the source and drain regions 2 and the oppositely doped semiconductor material of the semiconductor body 1. The junctions 6 adjoin the upper surface of the substrate at the ends of the channel, which extends from source to drain between the junctions.

Above the gate dielectric 3, a gate electrode 7 is arranged, which may form part of a respective wordline and may be a structured polysilicon or metal layer. A further layer may have been provided as upper wordline layer 8, which can be metal or, if the gate electrode is polysilicon, a metal silicide, especially tungsten silicide. The gate electrode or wordline is electrically isolated by a cover layer 9, for example silicon nitride, and sidewall spacers 10, for example silicon dioxide. In an array of memory cells, local interconnects to bitlines that are arranged above the wordlines and run across the wordlines, can be applied between the gate electrodes of adjacent memory cells and between adjacent wordlines in the regions marked LI in FIG. 1. The interconnects are connected with the source and drain regions 2 through openings 14 in the dielectric layer on the surface of the substrate. The strips of the charge-trapping layer 5 are located below the lower edges of the gate electrode 7.

By this structure, it is possible to generate an electric field across the charge-trapping layer sequence 4, if an appropriate voltage is applied between the gate electrode and source and drain. A typical gate voltage is +12 V, while source and drain are, for example, at −5 V. The electric field induces Fowler-Nordheim-tunnelling of electrons out of the substrate through the gate dielectric into the charge-trapping layer 5. Although it cannot completely be avoided that a small number of electrons tunnel through the middle section of the gate dielectric 3, the structure of the memory cell can be adapted so as to favor the electron current in the areas of the charge-trapping layer strips. Apart from the chosen material, the layer thicknesses are essential in this respect.

FIG. 1 shows the layer thicknesses indicated by small arrows, which distinguish the thickness $th_{S1}$ of the single gate dielectric 3 in the middle section of the channel, the total thickness $th_{S2}$ of the gate dielectric in the region of the charge-trapping layer sequence 4, including the strips, and the thickness th of the charge-trapping layer 5. The layer thicknesses are arranged so that the electric field strength in the area of the charge-trapping layer sequence 4 is greater or at least equal to the electric field strength in the single gate dielectric layer above the middle part of the channel. As the value of the electric field strength is given by the derivative of a voltage along the chosen path, the total thickness of the layer between the electrodes and the voltage drop according to the relative permittivity of the material have to be taken into account. Here, the electrodes are the gate electrodes 7 and the electrically conductive semiconductor material below the gate dielectric. To simplify the calculation, an equivalent oxide thickness is introduced, which substitutes the real physical thickness of the layer in the calculation of the electric field strength. In the case of the charge-trapping layer of silicon nitride, embedded in surrounding silicon dioxide of the gate dielectric single layer, the equivalent oxide thickness of the nitride layer is approximately half its physical thickness. Therefore, the average value of the electric field in the middle part of the gate dielectric is $V/th_{S1}$, if V denotes the applied voltage. In the area of the charge-trapping layer sequence 4, the voltage is modified by a voltage shift $V_{SH}$ due to the charge in the charge-trapping layer 5. Here, the electric field has the value $(V-V_{SH})/(th_{S2}-0.5\ th)$. The average electric field across the charge-trapping layer sequence has to be greater than or at least equal to the electric field in the area of the single layer gate dielectric 3. This condition gives a minimum value for the thickness th of twice $th_{S2}$ times the ratio of $V_{SH}$ and V: $th \geq 2\ th_{S2}\ V_{SH}/V$. For V=12 V, $V_{SH}$=2.5 V and $th_{S2}$=16.5 nm, th has to be at least 6.875 nm. Therefore, the condition can easily be complied with. Other embodiments may deviate in dimensions, but it can be achieved that the tunnel current through the charge-trapping layer sequence is larger than the electron flux in the middle region of gate dielectric 3 by a factor of typical 100, which is required for an adequate operating performance. The condition can be stated more generally. The thickness th of the charge-trapping layer 5 should be at least the product of the total thickness $th_{S2}$ of the gate dielectric in the area of the strips, the reciprocal value of the equivalent oxide thickness of the material of the strips, and the quotient of a shift of a threshold voltage of the memory cell due to the erasure and a voltage applied to the gate electrode for the erasure. Herein, a gate dielectric formed of silicon oxide is assumed. Further calculations and embodiments are described in conjunction with FIGS. 6 and 7.

Figure 2:
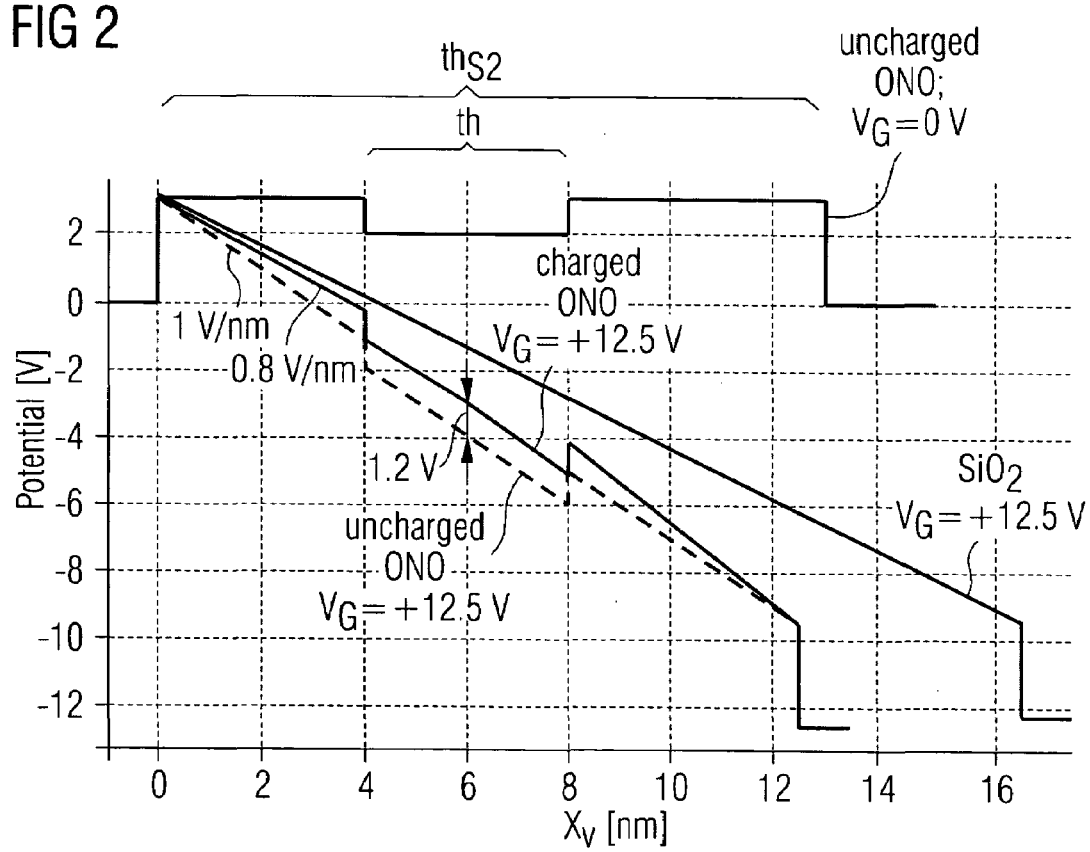
FIG. 2 shows a diagram of the electric potential across the charge-trapping layer.

FIG. 2 shows a diagram of the electric potential across the charge-trapping layer sequence 4. The distance from the upper surface of the semiconductor body 1, $X_V$, designated by the vertical arrow on the left-hand side of FIG. 1, measured in nm, is the entry on the abscissa. The values of the potential are given by a fat curve, corresponding to an uncharged ONO layer sequence with the gate electrode at 0 V, the lower slim curve is the potential of a charged ONO layer with the gate electrode at 12.5 V, and the broken line represents the potential for an uncharged ONO layer with the gate electrode at 12.5 V. The bottom oxide thickness is 4.0 nm, the nitride charge-trapping layer thickness is 8.0 nm, equal to an equivalent oxide thickness of 4.0 nm, and the upper blocking oxide layer is 4.5 nm thick. The potential is also shown for a 16.5 nm thick simple gate dielectric layer of silicon dioxide with the gate electrode at 12.5 V, for comparison. The absolute values of the negative slopes of the potential curves of the uncharged and charged ONO layers with the gate electrode at 12.5 V within the range of the lower bottom oxide layer are indicated as 1 V/nm and 0.8 V/nm, respectively. The difference of the potential for the uncharged and charged ONO layers of 1.2 V in the center of the charge-trapping layer is indicated by the double arrow. The voltage shift of 2.5 V between the electric potential in the 16.5 nm thick oxide layer in the middle region of the channel and the central plane of the charge-trapping layer strips can also be read from this diagram.

Programming, which means a write process, is performed by lowering the threshold voltage at the respective end of the channel. This is effected by hot hole injection from the channel using a relatively low current in the nA range. To this purpose, a negative voltage is applied to the gate electrode, and the source or drain region at the gate edge, where the charge-trapping layer is to be programmed, is supplied with a positive voltage pulse. The charge carrier injection takes place near the junction 6, and because of the limited extension of the charge-trapping layer strips the problem of insufficient neutralization of charge carriers in the middle of the channel is mitigated. This results in a significantly improved cycling behavior.

Typical operating voltages are as follows: to erase the memory cells, a voltage of typically 12 V is applied to the gate electrode, source and drain are at −5 V, and the substrate may be set to −5 V, too; to write one bit of the two-bit cell, typically −7 V is applied to the gate electrode, source is set to 0 V or floating, and drain is at 4 V; the cell is read by applying 3 V to the gate electrode, 1.6 V to source and 0 V to drain. If a somewhat longer erase time can be tolerated both the substrate potential and the source and drain potentials may be chosen to be 0 V. To write or read the other bit, programming and reading voltages between source and drain are reversed.

If the memory cell is integrated in a memory cell array forming a virtual ground architecture, hot hole injection takes place also in a neighboring memory cell. If a bit has to be programmed in the memory cell on the right-hand side of FIG. 1, a voltage of +4 V is applied to the drain region 2. This electric potential is also present at the junction 6 on the left side of this drain region, which means, below the charge-trapping layer strip 5 on the right side of the left memory cell in FIG. 1. In order to avoid a programming of the charge-trapping layer strip of this adjacent memory cell, the source region of the adjacent cell, shown on the left side of FIG. 1, is set to an inhibit voltage of typically +2 V. Therefore, in the process of programming, a bitline adjacent to the bitline selected for programming must be set to the inhibit voltage. This requirement can be met with a bitline architecture of two local bitlines connected to each global bitline or with four local bitlines connected to each global bitline.

Figure 3:
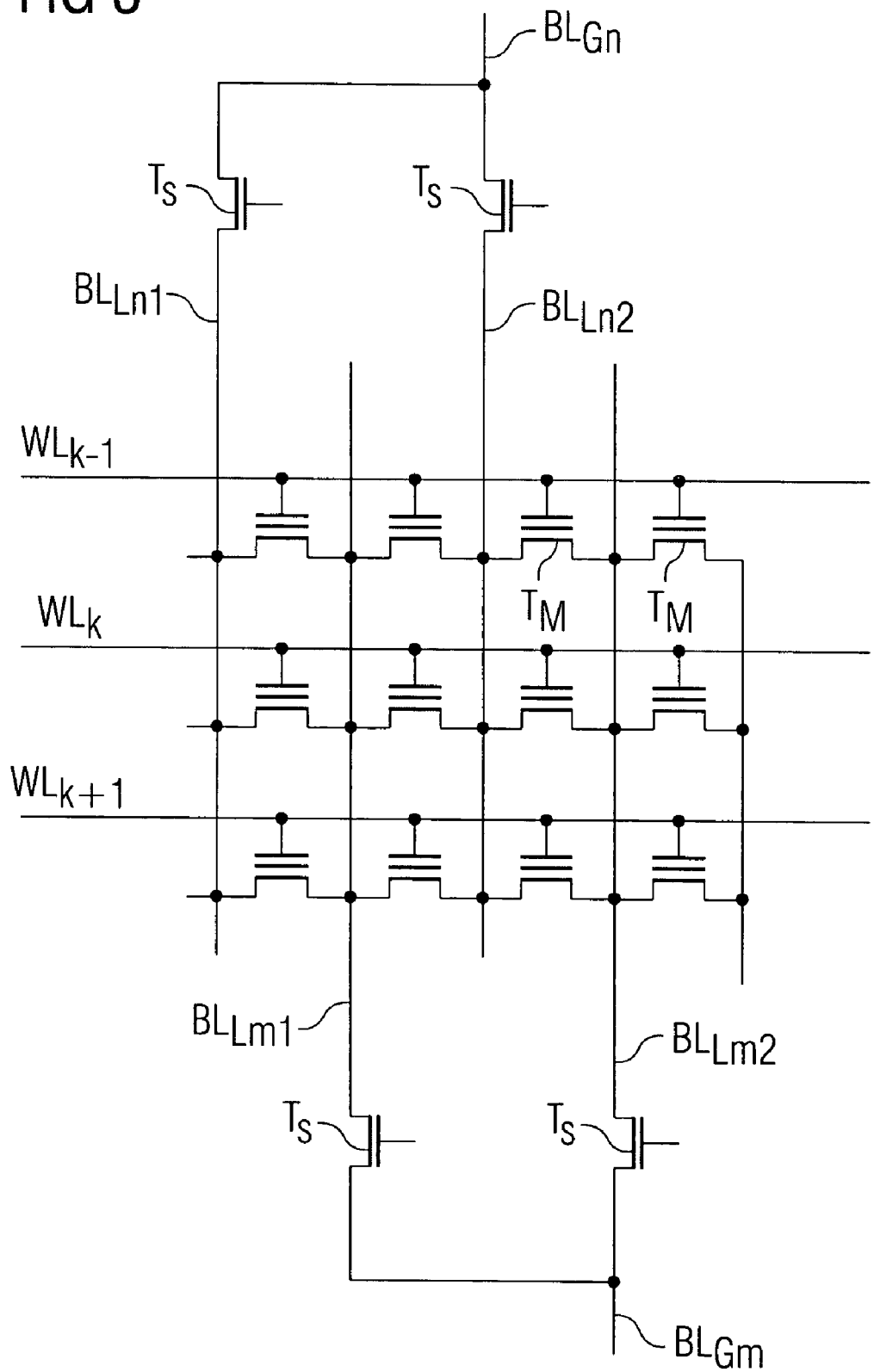
FIG. 3 shows a circuit scheme of an example of a memory device comprising an array of memory cells.

FIG. 3 shows a circuit scheme of memory cells $T_M$ arranged in a memory cell matrix array, connected by rows of wordlines and columns of bitlines. In the sequence of bitlines, continuously numbered pairs of bitlines of subsequent odd or even numbers, respectively, are in each instance connected to one global bitline $BL_G$. Thus, it is possible to apply the inhibit voltage to a local bitline $BL_L$ adjacent to the bitlines selected to address a memory cell to be programmed. The local bitlines can be selected by switch transistors $T_S$. If a grounded source with a more accurately determined potential is required, rather than a floating one, an additional source supply line and corresponding switch transistors have to be designed in. It should be noted that the scheme of FIG. 3 does not show the actual orientation of the channel direction of the cell transistors from source to drain, which is across the wordlines.

Figure 4:
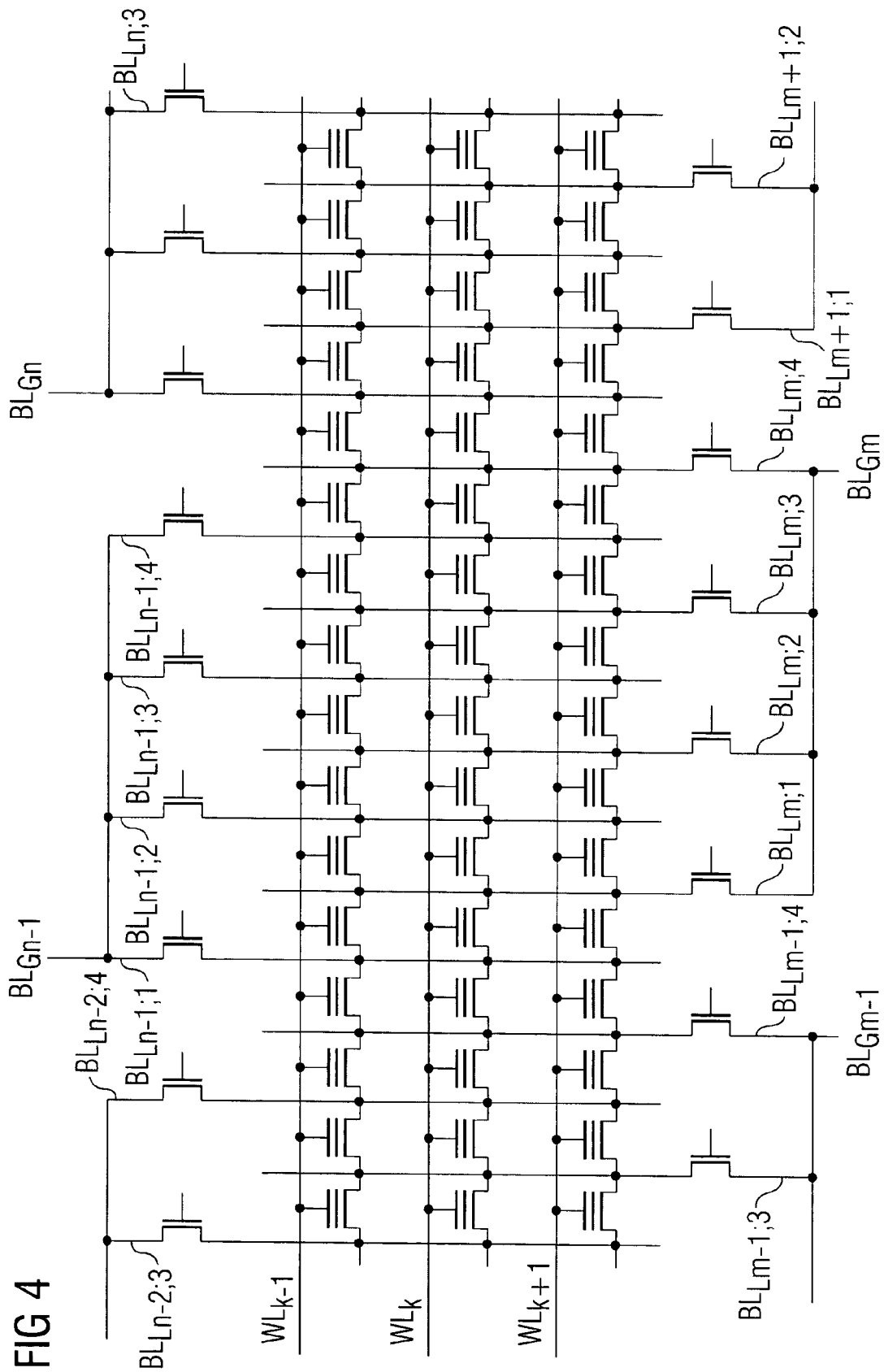
FIG. 4 shows a circuit scheme according to FIG. 3 of a further embodiment.

FIG. 4 shows a circuit scheme according to FIG. 3 for an arrangement of bitlines in which each global bitline $BL_G$ is connected to four local bitlines $BL_L$. As shown in FIG. 4, the local bitlines are connected in interdigitated comb-like structures analogous to the arrangement shown in FIG. 3. If, for example, +4 V is applied to the drain region of the memory cell to be programmed, the local bitline $BL_L$ leading to this drain region is connected to said voltage. The appertaining select transistor is conducting so that the switch is closed. The inhibit voltage of 2 V is applied to the global bitline $BL_G$ which is connected to the local bitlines that are interdigitated to the bitlines comprising the local bitline selected for programming. If the selected local bitline is, for example, the bitline $BL_{Ln-1,3}$, the local bitline $BL_{Lm;2}$ can be set to the inhibit voltage of 2 V so that no programming takes place in the memory cells between these local bitlines. As the local bitline $BL_{Lm;3}$ is disconnected from the global bitline $BL_{Gm}$ by the respective select transistor, all the source regions of the memory cell transistors between the bitlines $BL_{Ln-;1,3}$ and $BL_{Lm;3}$ are floating and can be selected as storage address via the wordline that is connected to the gate electrode of the memory cell transistor in question.

FIG. 5 schematically shows the electron potential across the channel for a prior art memory cell (left side) and for the inventive memory cell (right side). Reading the bit on the left end of the channel is considered. By the mechanism of punch-through, the influence of the right bit that is not to be read can be reduced in two-bit cells. This effect is due to an extension of the space-charge region because of the positive junction voltage, typically 1.6 V. Consequently, the potential in the range of the space-charge region is reduced, and the influence of the right bit, eventually having a high threshold voltage, is virtually cancelled. This is not completely possible with the prior art cell because the punch-through does not extend far enough. This can be seen in FIG. 5.

Figure 5A:
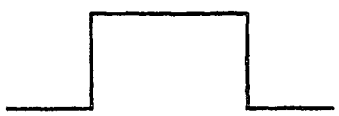
FIGS. 5a–5f (collectively FIG. 5) show prior art diagrams for the erasure, read and write procedures.
Figure 6A:
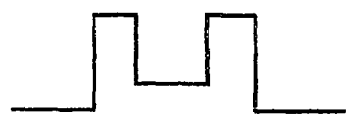
FIGS. 6a–6f (collectively FIG. 6) show simplified potential diagrams for the erasure, read and write procedures.
Figure 5B:
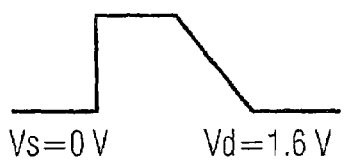
Figure 6B:
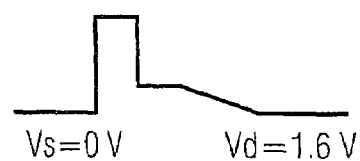
Figure 5C:
Figure 6C:
Figure 5D:
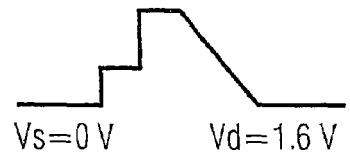
Figure 6D:
Figure 5E:
Figure 6E:
Figure 5F:
Figure 6F:

FIGS. 5a and 6a show the electron potential in the erased state without read voltage applied. FIGS. 5b and 6b show the electron potential when the indicated read voltages are applied. FIGS. 5c and 6c show the potential in the case of the left bit programmed and the right bit erased. FIGS. 5d and 6d show the read potential in this case; the applied voltages are inserted in the figure. FIGS. 5e and 6e show the initial potential for the case of the left bit erased and the right bit programmed. FIGS. 5f and 6f show the potential for the state of both bits programmed. The corresponding read potentials are the same as those shown in FIGS. 5b and 6b and 5d and 6d. A comparison of FIGS. 5a to 5f with FIGS. 6a to 6f shows the reduced effect due to the reduction of charges that are trapped above the middle region of the channel in the inventive memory cell. If the charge-trapping layer is interrupted in the middle channel region, the punch-through region is extended to the edge of the charge-trapping layer strip, and, since the middle region of the channel is at low potential, the left-hand bit can be read without interference. The middle region of the channel remains free from electrons in spite of the Fowler-Nordheim erasure mechanism. A basic requirement of sufficient two-bit separation and consequently of interference-free reading is fulfilled. The endurance of the cell over a large number of programming cycles is essentially improved.

FIG. 23 shows a diagram, in which the ratio $\gamma$ of the thicknesses th and $th_{S1}$ is shown as a function of the threshold voltage shift $V_{SH}$. The curves depend on the material of the charge-trapping layer and on the parameter $\delta=(th_{S2}-th_{S1})/th_{S1}$:

$\gamma=[1+2\delta-(1-4\,V_{SH}/(E_{ONO}\times th_{S1}))^{1/2}]\times\epsilon_N/[2(\epsilon_N-\epsilon_{OX})]$, where $E_{ONO}$ is the electric field in the silicon dioxide films of the area of the charge-trapping layer sequence before charging and $\epsilon_N$ and $\epsilon_{OX}$ are the relative permittivities in the material of the charge-trapping layer and in the gate dielectric, respectively. The actually represented curves are linear approximations by setting $(1+a)^{1/2}\approx 1+a/2$:

$\gamma\approx(\delta+V_{SH}/(E_{ONO}\times th_{S1}))\times\epsilon_N/(\epsilon_N-\epsilon_{OX})$.

Curve A is the function for a charge-trapping layer of silicon nitride ($Si_3N_4$, $\epsilon_N=7.8$), $\delta=0$; curves B, C, and D are corresponding curves for the materials $HfO_2$ ($\epsilon_N=25$), $Al_2O_3$ ($\epsilon_N=12$), and $Si_3N_4$ ($\epsilon_N=7.8$) with $\delta=0.125$ in each case.

The horizontal straight line E shows that it is necessary to have $th/th_{S1}$ at least 0.5 in the case of a charge-trapping layer of silicon nitride and $\delta=0.125$, if the threshold voltage shift $V_{SH}$ is to be at least 2.0 V. The horizontal line F is the limit of the maximum possible value of $th/th_{S1}$. This value is given by $(th_{S2}-\min(th_{S2}-th))/th_{S1}$, where the "$\min(\ldots)$" denotes the minimal value regarded as necessary for the sum of the thicknesses of the bottom (lower) and blocking (upper) oxide layers of the charge-trapping layer sequence. In a typical example with $\delta=0.125$, $th_{S1}=16$ nm, $th_{S2}=18$ nm, and $\min(th_{S2}-th)=9$ nm, the value of the ordinate of line F is 0.5625.

A threshold voltage shift of 2 V is usually considered as necessary to be able to distinguish between programmed states of logical zero and logical one. Line F and one of lines A, B, C, D represent the upper and lower limits of the values of preferred embodiments. The actual value of the threshold voltage shift should not deviate too much from a preferred value of 2.0 V.

FIG. 7 shows three diagrams of $th/th_{S1}$ as function of $\delta$ for different thicknesses $th_{S1}$, voltage shifts $V_{SH}$ and charge-trapping materials, in each case $th_{S2}-th=9$ nm. Curves F are the upper limit corresponding to line F in FIG. 23. Curve D in FIG. 7a shows the function for a charge-trapping layer of silicon nitride, $th_{S1}=16$ nm and $V_{SH}=2$ V. FIG. 7b shows the same for $th_{S1}=14$ nm, $V_{SH}=2$ V (curve D) and $V_{SH}=1.75$ V (curve G). FIG. 7c shows the function for a charge-trapping layer of $HfO_2$ (relative permittivity 25), $th_{S1}=12$ nm and $V_{SH}=2$ V.

From the diagrams in FIG. 7, the following preferred embodiments can be derived. If the gate dielectric is silicon dioxide and the charge-trapping layer is silicon nitride, the ratio of the layer thickness of the charge-trapping layer and the layer thickness of the gate dielectric in an area between the strips is preferably between 0.3 and 0.7. If the gate dielectric is silicon dioxide and the charge-trapping layer is $Al_2O_3$, the ratio of the layer thickness of the charge-trapping layer and the layer thickness of the gate dielectric in an area between the strips is between 0.25 and 0.6. If the gate dielectric is silicon dioxide and the charge-trapping layer is $HfO_2$, the ratio of the layer thickness of the charge-trapping layer and the layer thickness of the gate dielectric in an area between the strips is between 0.2 and 0.5

FIG. 8 shows cross-sections of intermediate products of preferred manufacturing methods. FIG. 8a shows a substrate with a layer of the gate dielectric 3 and a gate electrode 7, which have been structured to have common edges. The substrate is preferably silicon, and the gate dielectric is preferably silicon dioxide. This material is removed beneath the sidewalls of the gate electrode by a wet etching step, for example using buffered HF, as shown in FIG. 8b. A dry etching process is also applicable, but wet etching is preferred. The oxide layer is, for example, 16 nm thick, as in the above described embodiment of the memory cell. Then, oxide layers are produced on upper and lower surfaces, where the gate dielectric 3 has been removed, leaving spaces provided for the strips of the charge-trapping layer.

Figure 8A:
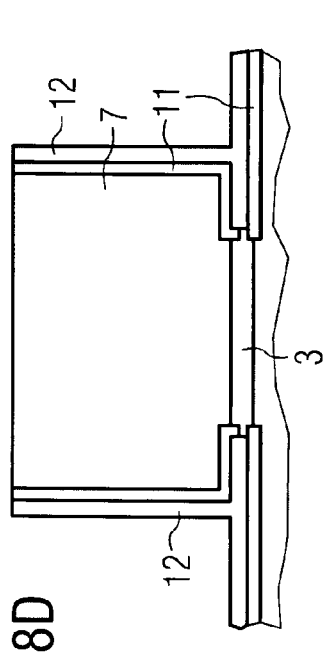
FIGS. 8a–8f (collectively FIG. 8) show cross sections of intermediate products of a preferred manufacturing method.
Figure 8B:
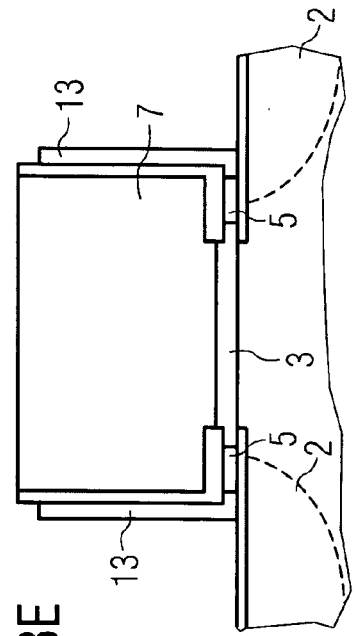
Figure 8C:
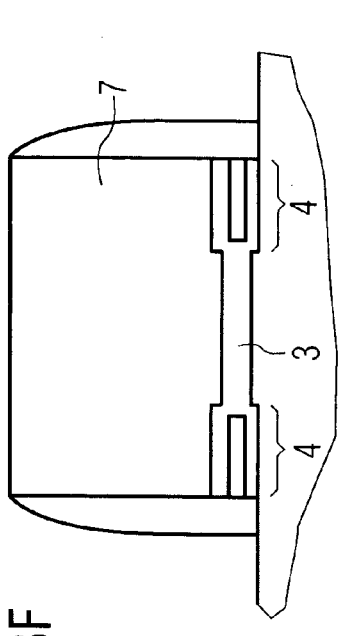

The oxide layers can be grown as thermal oxide, which may be typically about 4 nm thick. This is shown in FIG. 8c, where a gate electrode 7 of polysilicon is assumed. In this case, the thermal oxide also grows on the sidewalls and the lower surface of the lower edges of the gate electrode. The thermal oxide film 11 grows slightly thicker on the polysilicon than on the substrate because of different growth rates of heavily doped polysilicon and crystalline silicon.

If the gate electrode is a metal, which is also possible in principle, the upper oxide layer produced on the lower surfaces of the gate electrode has to be deposited in a separate process step, for example by an HTO deposition process (high temperature oxide). However, the best mode of the method applies polysilicon as gate electrode. The thermal oxide need not be grown to the total required thickness; instead, it may be advantageous only to grow a thin layer of, for instance, 2 nm thickness and to deposit an additional oxide layer, for instance as HTO. This offers the possibility to better adapt the layer thicknesses to the requirements. In any case, the upper oxide layer should be at least 0.5 nm thicker than the lower oxide layer.

Figure 8D:
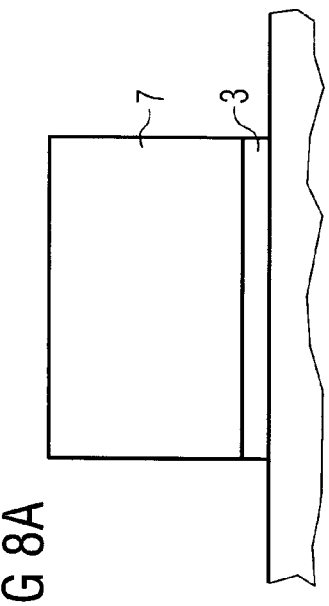

A conformal deposition of the material provided for the charge-trapping layer, in this example silicon nitride, follows, which can be performed, for example, by LPCVD (Low Pressure Chemical Vapor Deposition). In this process step the slits between the semiconductor body and the gate electrode are completely filled with nitride, as shown in FIG. 8d. The nitride layer 12 is subsequently removed from the sidewalls of the gate electrode and the upper surface of the substrate laterally adjacent to the gate electrode. The nitride is preferably removed by a wet etching process step.

Figure 8E:
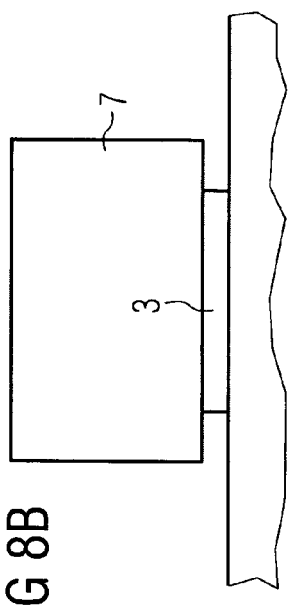
Figure 8F:
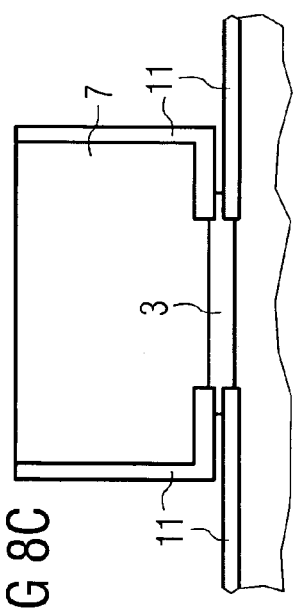

Then, as shown in FIG. 8e, oxide spacers 13 can be deposited to protect the remaining nitride strips of the charge-trapping layer 5, before doping atoms to form source and drain regions 2 are implanted. If the implantation takes place after a thermal oxidation and after the deposition of the nitride strips 5, there will be no excessive diffusion of the doping atoms towards the channel region, which might diffuse the junctions out of the regions under the charge-trapping layer strips 5. The preliminary spacers 13 can be removed and substituted by the final sidewall isolation of the gate electrode, as shown in FIG. 8f. Additional process steps, known per se and analogous to the prior art technology, follow in order to complete the manufacturing process.

Figure 9:
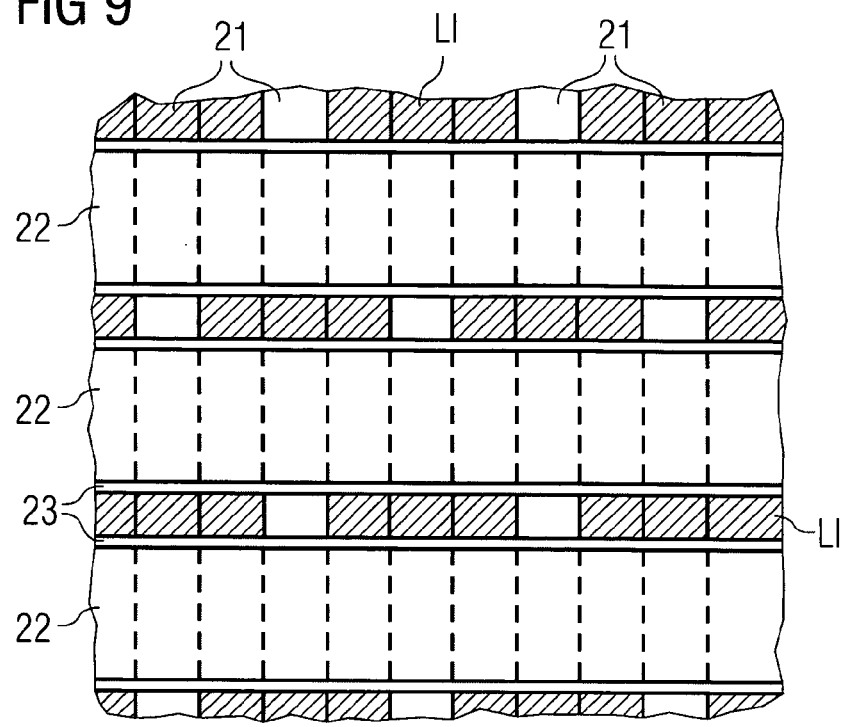
FIG. 9 shows the relative positions of trench isolations, wordlines and spacers as well as the regions provided as local interconnects to bitlines in an array of memory cells.

FIG. 9 shows a plan view of a memory array giving the relative positions of STI isolations 21, wordlines 22 with lateral spacers 23, and the regions that are to be electrically conductively connected to one another and to the bitlines. The STI isolations (shallow trench isolation) are isolation trenches that are arranged parallel at a distance from one another and between which there are in each case channel regions of the transistors that run parallel to the isolation trenches below each wordline 22. The wordlines therefore run over the channel regions arranged transversely with respect to the longitudinal direction of the wordline. The source and drain regions of the cell transistors are in each case present in a manner laterally adjoining the wordlines. The source and drain regions are electrically conductively connected in the regions LI that are highlighted in hatched fashion in FIG. 9, already mentioned in conjunction with FIG. 1 and designated as local interconnects, a short piece of the isolation trench being bridged in each case.

Figure 10:
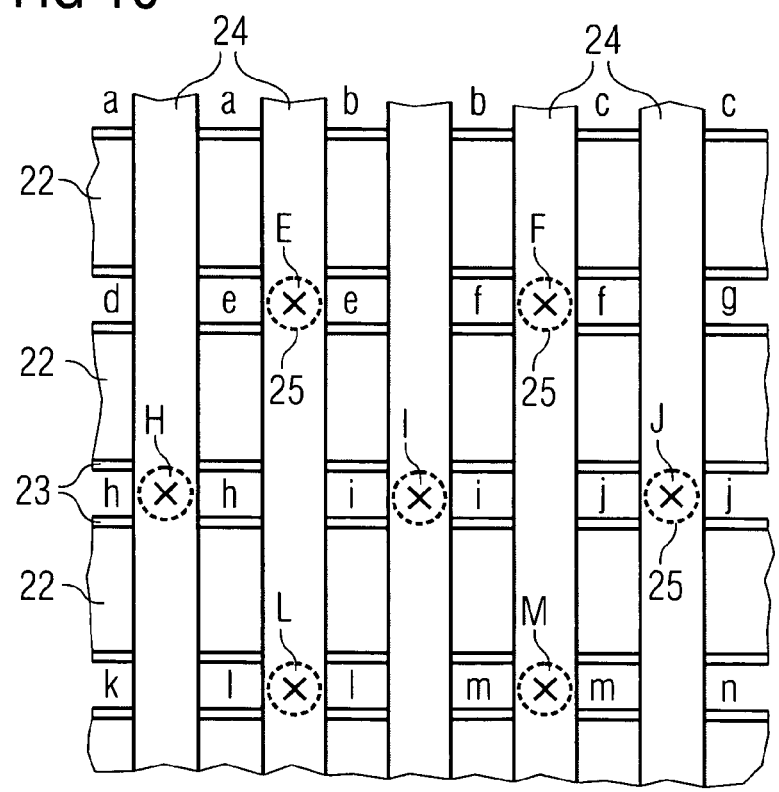
FIG. 10 shows the view of FIG. 9 with applied bitlines.

FIG. 10 illustrates a plan view of this arrangement including the bitlines 24 applied above the wordlines 22. The regions depicted in hatched fashion in FIG. 9 are in each case designated by the same lower-case letters in FIG. 10. The local interconnects are contact-connected by the bitlines 24. The bitline contacts 25 are depicted by broken lines as concealed contours in FIG. 10 and identified by a cross. Furthermore, the bitline contacts 25 are in each case designated by that upper-case letter which corresponds to the lower-case letter of the appertaining local interconnect. It can be seen in FIG. 10 that the bitlines 24 are in each case electrically contact-connected to local interconnects which are arranged successively in the direction of the bitlines in each case in next but one interspaces between the wordlines 22.

A corresponding manufacturing method will now be described in conjunction with FIGS. 11 to 22. FIGS. 11, 13, 16, 18 and 21 show cross-sections through the active areas of the memory cell array after different process steps. FIGS. 12, 14, 17, 19 and 22 show cross-sections through electrically insulated areas between the memory cell array after different process steps. The insulated areas are shallow trench isolations (STIs) running across the wordlines between adjacent memory cells of each sequence of memory cells along the wordlines, according to the view shown in FIG. 9.

Figure 11:
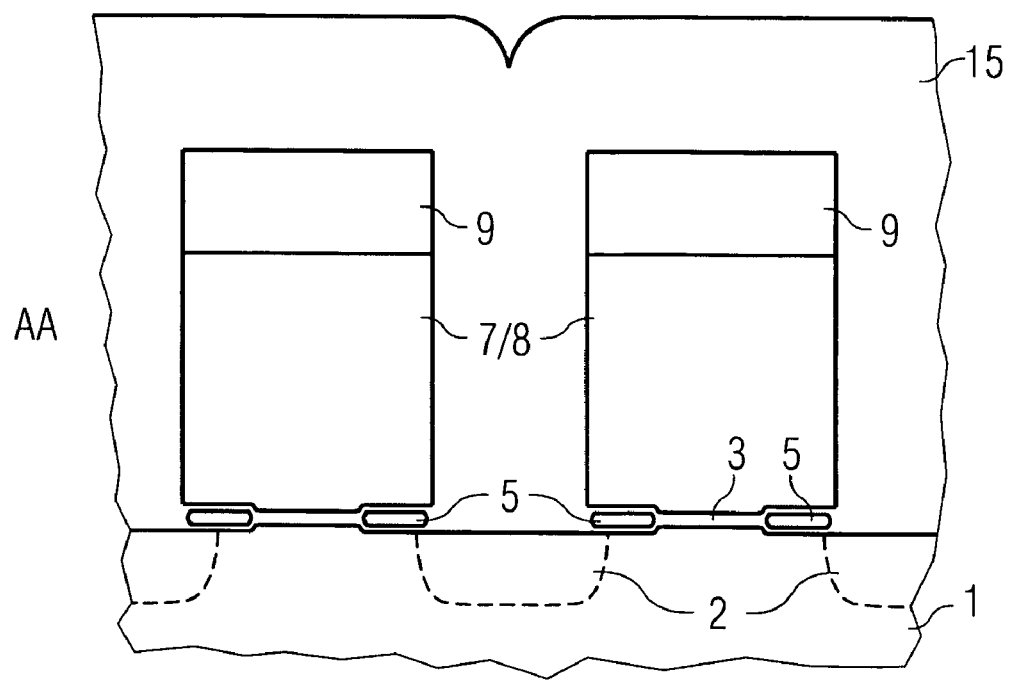
FIGS. 11 to 22 show intermediate products of a preferred method of manufacturing an array according to FIGS. 9 and 10.

FIG. 11 shows the substrate or semiconductor body 1 with two adjacent memory cells and the source and drain regions 2. The wordlines 7/8 comprising the gate electrode are orthogonal to the plane of the drawing insulated by cover layer 9. The spaces between the wordlines are filled with a dielectric 15, preferably silicon dioxide.

Figure 12:
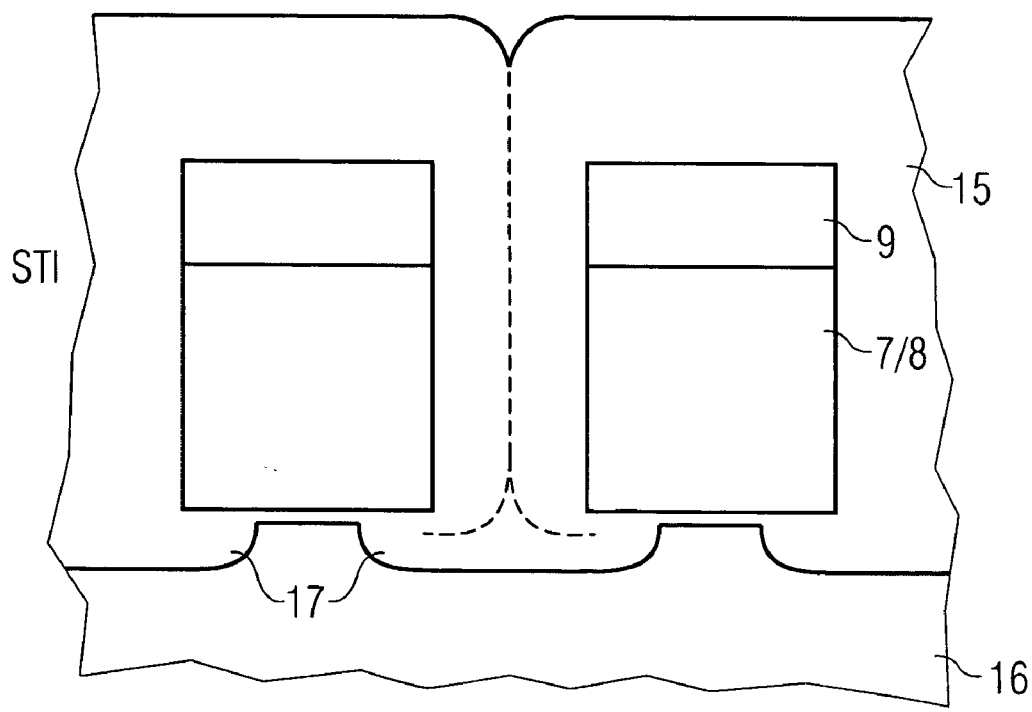

FIG. 12 shows the cross-section coplanar to the cross-section of FIG. 11 in the region of the STI. The trench filling 16 can be oxide, which is partially removed also in the vertical direction in the wet etching step to form the void spaces to be filled with the charge-trapping layer sequence. Therefore, in the regions 17 lateral to the inner strip of the gate dielectric, there are deeper openings to be filled with the dielectric 15. The dotted vertical line that bifurcates at its lower end shows the common boundary between the grown dielectric layers on the opposite wordline sidewalls.

Figure 13:
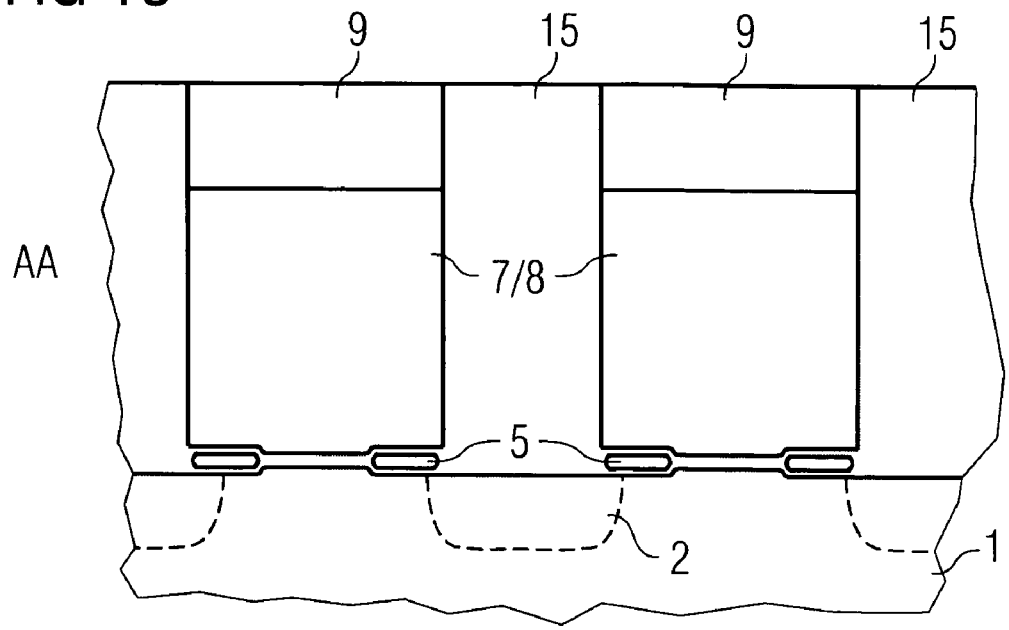
Figure 14:
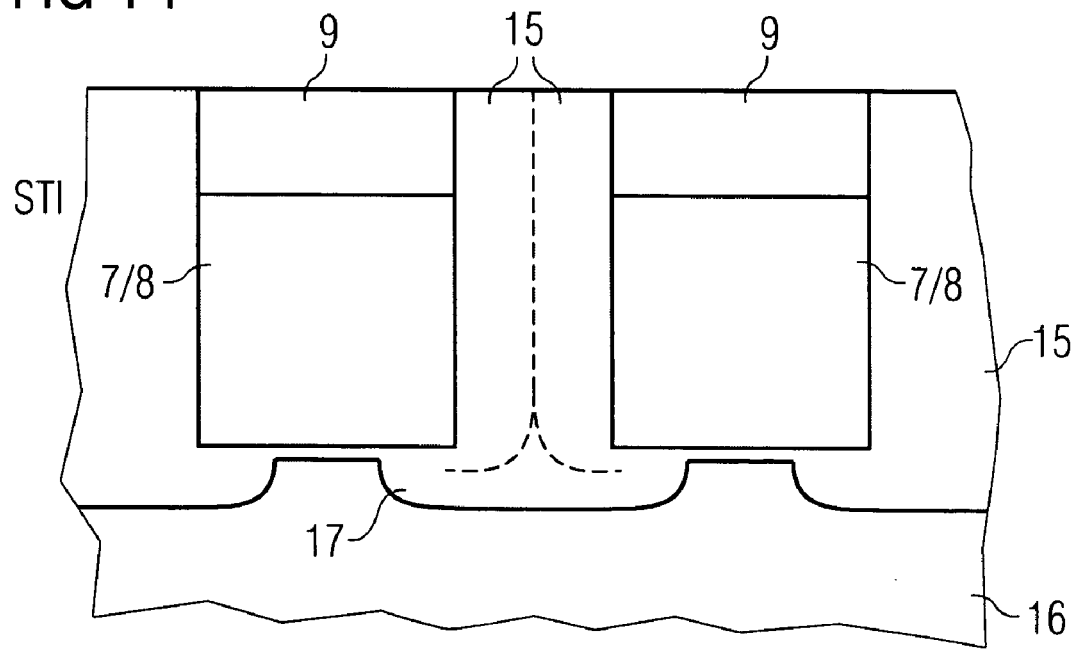

FIGS. 13 and 14 show the cross-sections according to FIGS. 11 and 12, after the dielectric 15 has been planarized to the upper level of cover 9.

Figure 15:
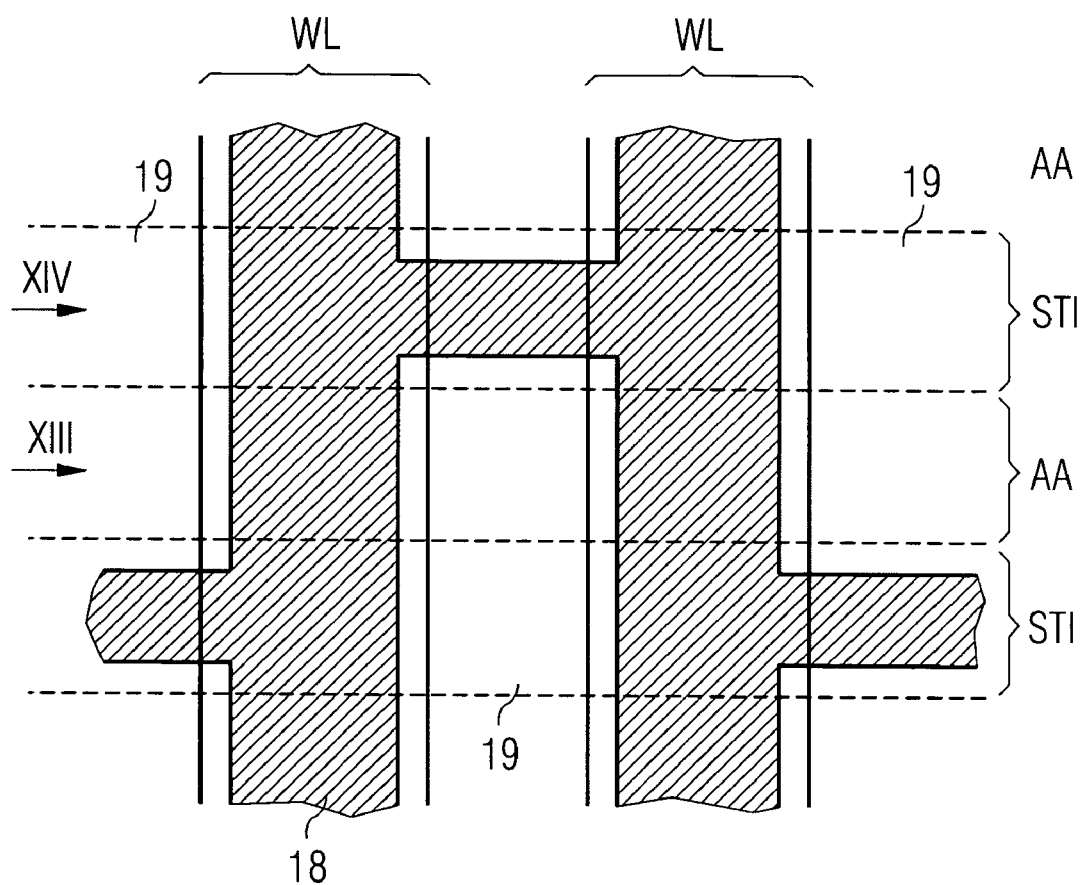
Figure 16:
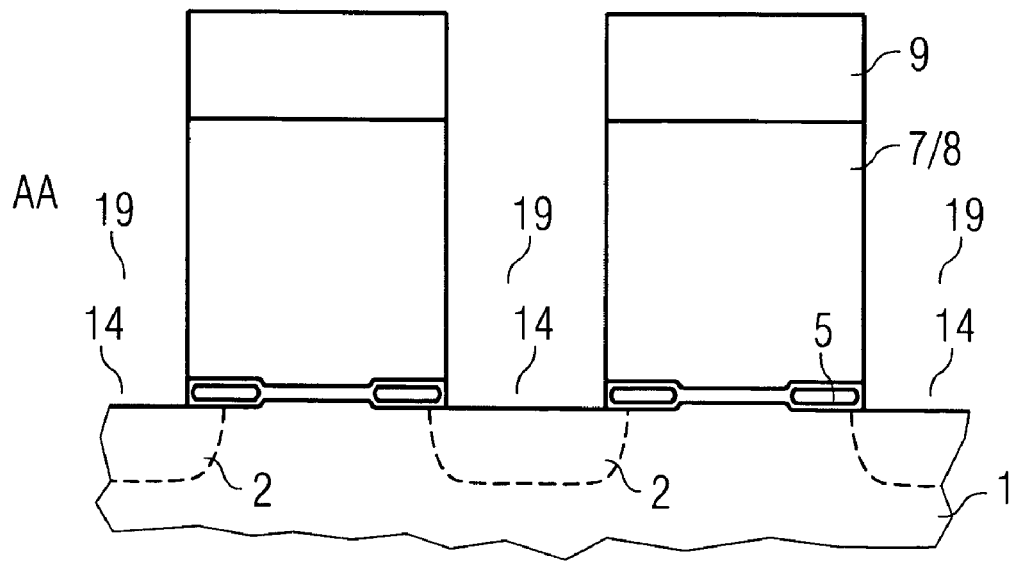

FIG. 15 shows a plane view of the arrangement of wordlines WL, active areas AA and shallow trench isolations STI. The position of the cross-sections of FIGS. 13 and 14 has been marked with arrows and Roman numerals. A resist layer is applied to the hatched region, which leaves those areas of the surface free which correspond to the local interconnect regions LI and where subsequently openings 19 are etched into the dielectric 15.

Figure 17:
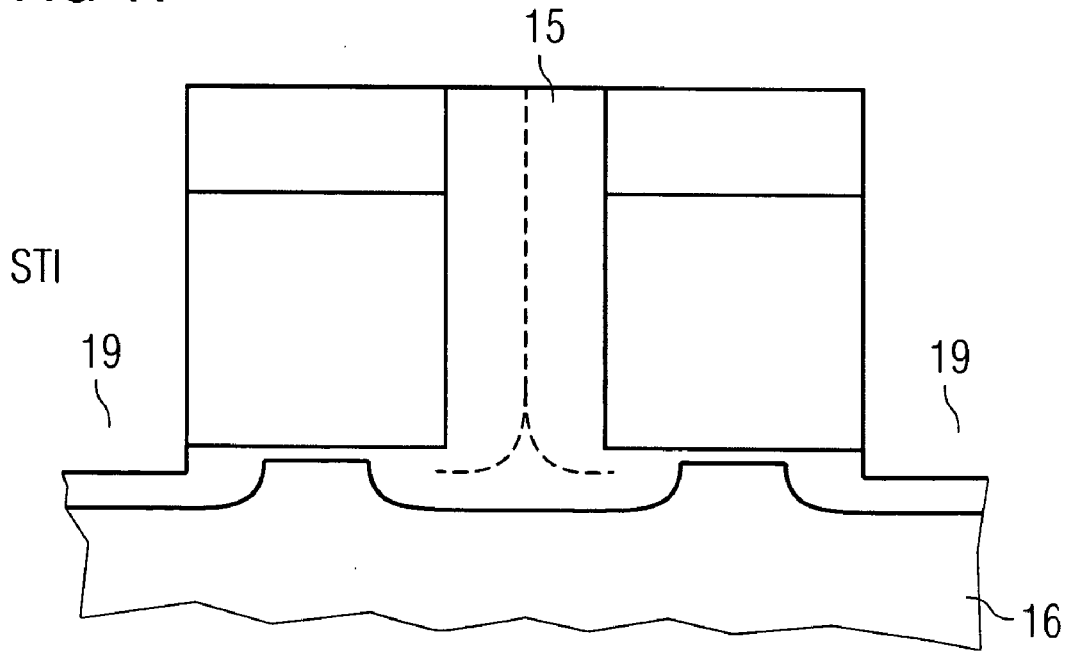

FIGS. 16 and 17 show, again for the active areas and the STI areas, the structure of the cell array after the etching of the openings 19, using the resist layer as mask. FIG. 17 clearly shows the location of the remaining parts of the dielectric 15, which has been left under the strips of the resist layer bridging the gaps between the wordlines. The bottoms of the openings 19 form the openings 14 between the layers of the gate dielectric, which have already been mentioned in connection with FIG. 1.

FIGS. 18 and 19 show, again for the active areas and the STI areas, the structure of the cell array after the formation of sidewall spacers 23, as usual by conformal deposition and anisotropic etching of a layer of the spacer material, for instance silicon dioxide.

Figure 18:
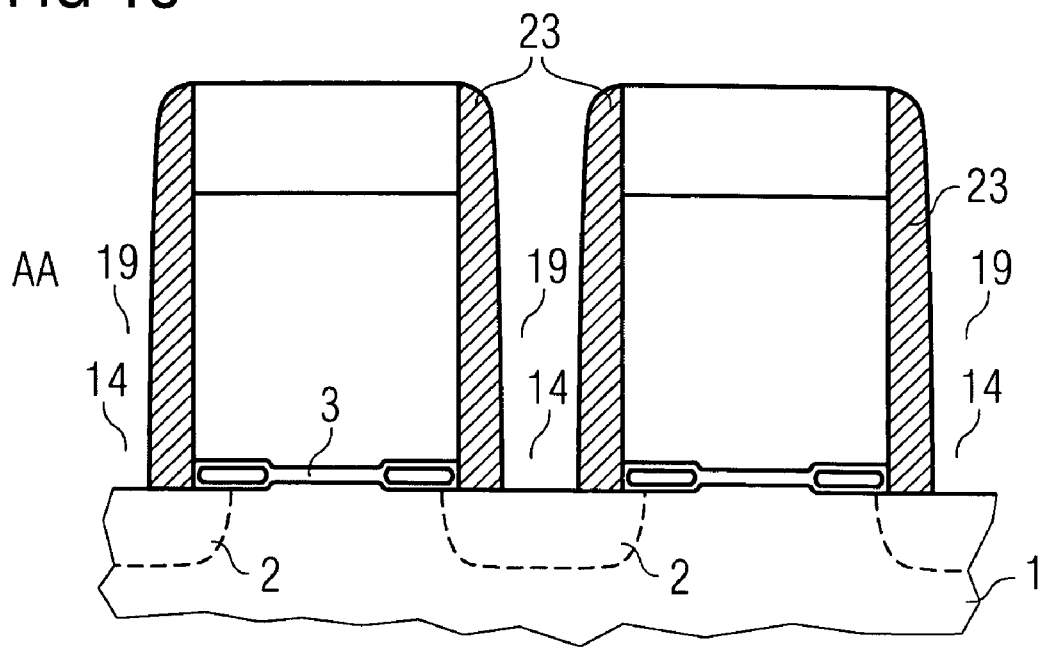
Figure 19:
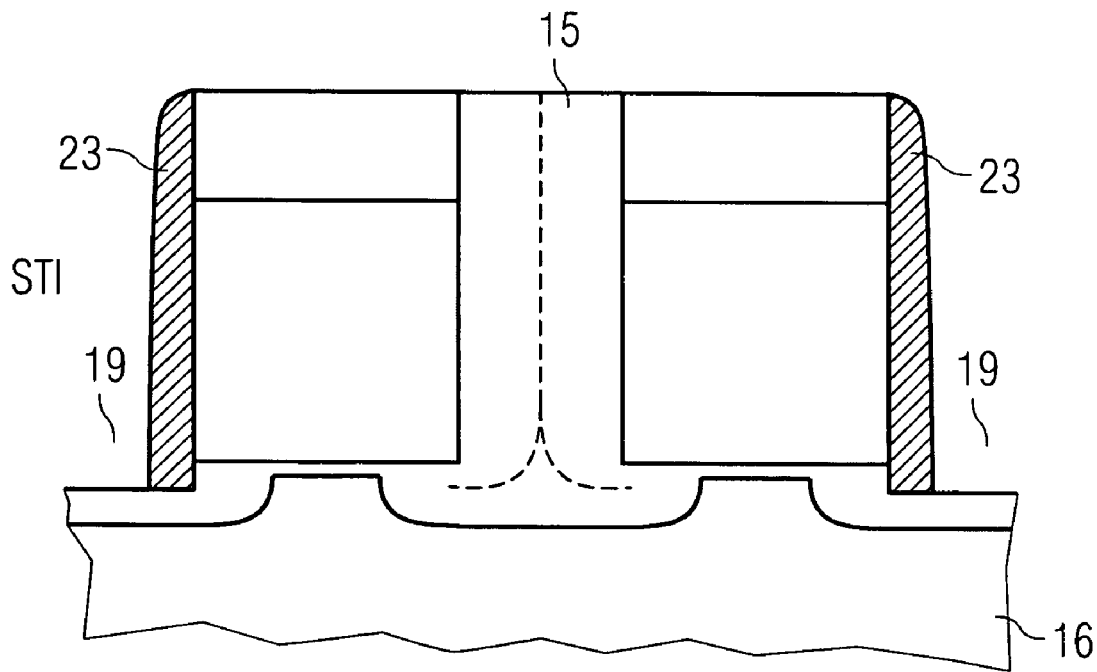
Figure 20:
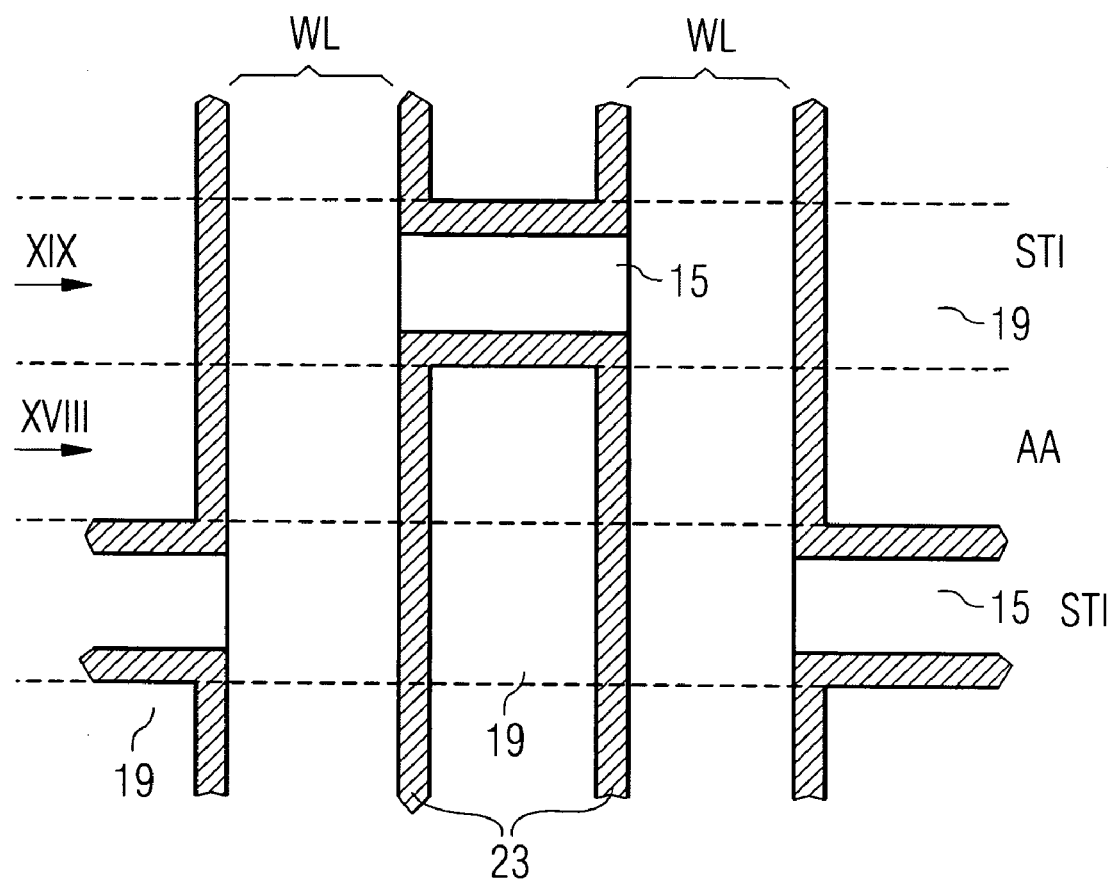

FIG. 20 shows a plane view according to FIG. 15, in which the cross-sections of FIGS. 18 and 19 are marked with arrows and Roman numerals. The locations of the spacers 23 and the residual dielectric 15, as well as the openings 19 are clearly distinguishable. The openings 19 are filled with an electrically conducting material provided for the local interconnects. Because of the openings 14, contacts are produced between the local interconnects and the source and drain regions 2.

Figure 21:
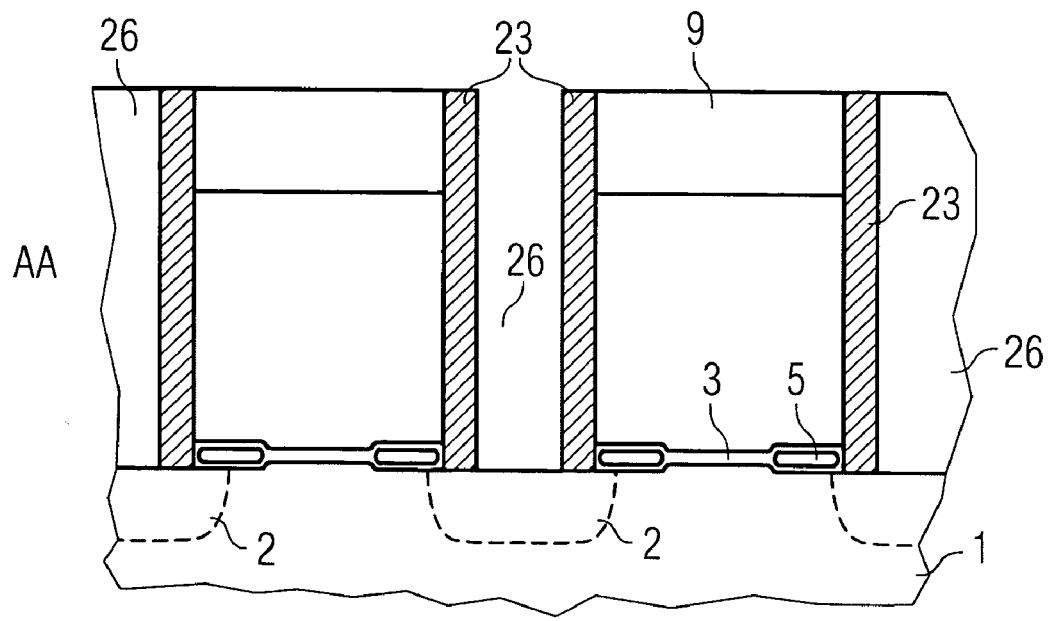

FIG. 21 shows the cross-section through the active area after deposition of the material of the local interconnects 26 into the openings 19 and subsequent planarization. The wordlines are electrically insulated from the local interconnects 26 by the sidewall spacers 23 and the cover 9. Bitlines are subsequently applied to the upper surface. To this purpose, a further dielectric layer is deposited on the planarized surface and provided with vias or contact holes above the local interconnects. An electrically conducting material, preferably a metal layer scheme like Ti/TiN/W or a metal like aluminum, is deposited and structured into bitlines running across the wordlines, as shown in FIG. 10, and contacting the local interconnects through said vias. FIG. 10 also shows which bitlines are connected to which local interconnects.

Figure 22:
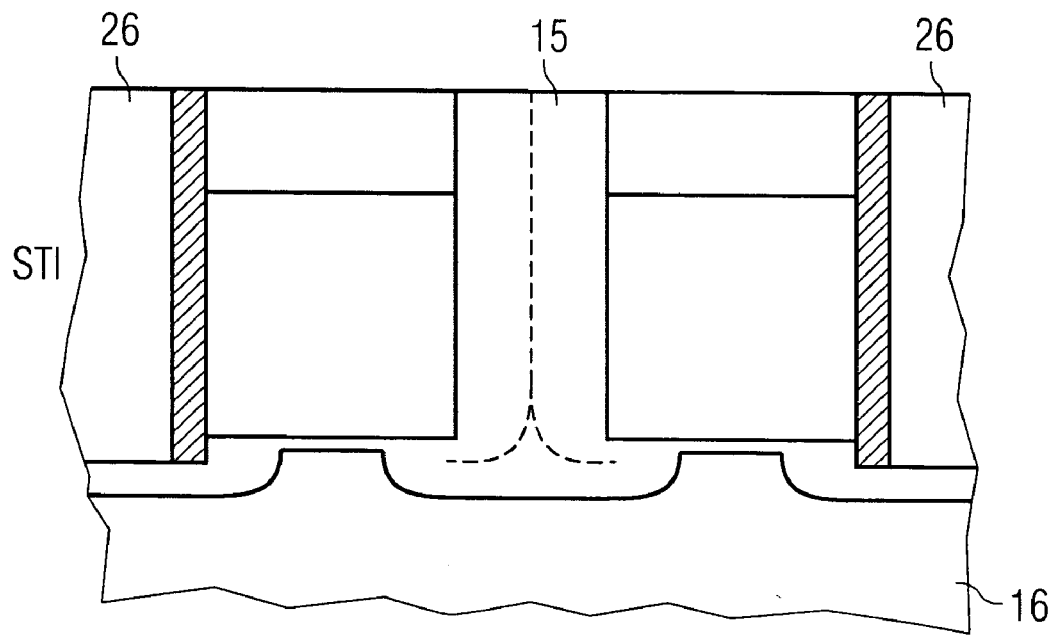

FIG. 22 shows the structure and arrangement of the local interconnects in the area of the STIs. A comparison with FIG. 10 reveals that the bitlines are preferably arranged in the regions of the STIs, i.e., in the plane of the cross-section shown in FIG. 22.

Although the invention has been described with reference to the preferred embodiments, it will be understood that the invention is not limited to the details described thereof. Especially the layers of the charge-trapping layer sequence can as well be arranged in a non-planar fashion to meet special requirements by an optimization of the electric field in the gate region.

What is claimed is:

1. Charge-trapping memory device comprising:
    a semiconductor body or substrate with at least one memory cell arranged in said semiconductor body or substrate;
    source and drain regions formed by doped regions in said semiconductor body or substrate and limited by junctions;
    a gate dielectric on a surface of said semiconductor body or substrate between said source and drain regions and having a layer thickness;
    a gate electrode on said gate dielectric; and
    a charge-trapping layer formed within said gate dielectric, the charge-trapping layer comprising two strips which are each located between an upper boundary of said junctions and said gate-electrode and which are enclosed by said gate dielectric,
    said strips being formed of a material with higher relative permittivity than the gate dielectric, and
    said strips having a layer thickness which is provided relative to said layer thickness of said gate dielectric in an area between said strips and a total layer thickness of said gate dielectric in an area of said strips in such a manner that a positive voltage applied to said gate electrode and provided for inducing a Fowler-Nordheim-tunnelling of electrons into said charge-trapping layer generates an electric field strength in said area of said strips, which is larger or equal to an electric field strength in said area between said strips during a process of erasure of said memory cell.

2. Charge-trapping memory device according to claim 1, in which said gate dielectric is silicon dioxide and said charge-trapping layer is silicon nitride; and
    a ratio of said layer thickness of said charge-trapping layer and said layer thickness of said gate dielectric in said area between said strips is between 0.3 and 0.7.

3. Charge-trapping memory device according to claim 1, in which said gate dielectric is silicon dioxide and said charge-trapping layer is $Al_2O_3$; and a ratio of said layer thickness of said charge-trapping layer and said layer thickness of said gate dielectric in said area between said strips is between 0.25 and 0.6.

4. Charge-trapping memory device according to claim 1, in which said gate dielectric is silicon dioxide and said charge-trapping layer is $HfO_2$; and a ratio of said layer thickness of said charge-trapping layer and said layer thickness of said gate dielectric in said area between said strips is between 0.2 and 0.5.

5. Charge-trapping memory device according to claim 1, in which said total layer thickness of said gate dielectric in said area of said strips is larger than said layer thickness of said gate dielectric in said area between said strips.

6. Charge-trapping memory device according to claim 5, in which said gate dielectric is silicon dioxide and said charge-trapping layer is silicon nitride; and
    a ratio of said layer thickness of said charge-trapping layer and said layer thickness of said gate dielectric in said area between said strips is between 0.3 and 0.7.

7. Charge-tapping memory device according to claim 5, in which said gate dielectric is silicon dioxide and said charge-tapping layer is $Al_2O_3$; and a ratio of said layer thickness of said charge-trapping layer and said layer thickness of said gate dielectric in said area between said strips is between 0.25 and 0.6.

8. Charge-trapping memory device according to claim 5, in which said gate dielectric is silicon dioxide and said charge-tapping layer is $HfO_2$; and a ratio of said layer thickness of said charge-trapping layer and said layer thickness of said gate dielectric in said area between said strips is between 0.2 and 0.5.

9. A memory device comprising:
    a semiconductor body or substrate with at least one memory cell arranged in said semiconductor body or substrate;
    source and drain regions formed by doped regions in said semiconductor body or substrate and limited by junctions;
    a gate dielectric on a surface of said semiconductor body or substrate between said source and drain regions and having a layer thickness;
    a gate electrode on said gate dielectric; and
    a charge-trapping layer fanned within said gate dielectric,
    the charge-trapping layer comprising two strips which are each located between an upper boundary of said junctions and said gate-electrode and which are enclosed by said gate dielectric,
    said strips being formed of a material with higher relative permittivity than the gate dielectric, and
    said strips having a layer thickness which is provided relative to said layer thickness of said gate dielectric in an area between said strips and a total layer thickness of said gate dielectric in an area of said strips in such a manner that a positive voltage applied to said gate electrode and provided for inducing a Fowler-Nordheim-tunnelling of electrons into said charge-trapping layer generates an electric field strength in said area of said strips, which is larger or equal to an electric field strength in said area between said strips during a process of erasure of said memory cell;
    wherein said memory cell is erased by applying a positive voltage to said gate electrode to induce Fowler-Nordheim-tunnelling of electrons into said charge-trapping layer;
    said memory cell is programmed at one of said strips of said charge-trapping layer individually by hot bole injection effected by a negative voltage applied to said gate electrode and a positive voltage applied to one of said source and drain regions adjacent to said strip; and
    said memory cell is read by applying a voltage between said source and drain regions of said memory cell, which is reverse to a voltage applied for programming.

10. The memory device according to claim 9, whereby,
    in an array of memory cells comprising:
    at least a first memory cell and a second memory cell adjacent to said first memory cell; and
    a continuous doped region comprising as integral parts thereof a first one of said source and drain regions of said first memory cell and a first one of said source and drain regions of said second memory cell;
    said first memory cell is programmed at one of said strips of said first memory cell adjacent to said first one of said source and drain regions of said first memory cell, by applying a positive inhibit voltage to a second one of said source and drain regions of said second memory cell.

* * * * *

UNITED STATES PATENT AND TRADEMARK OFFICE
CERTIFICATE OF CORRECTION

| | | |
|---|---|---|
| PATENT NO. | : 7,049,651 B2 | Page 1 of 1 |
| APPLICATION NO. | : 10/715142 | |
| DATED | : May 23, 2006 | |
| INVENTOR(S) | : Mikolajick et al. | |

It is certified that error appears in the above-identified patent and that said Letters Patent is hereby corrected as shown below:

Column 6, Line 50: delete "5$f$with" and insert --5$f$ with--.

In the Claims:

Column 12, Line 2: delete "fanned" and insert --formed--.
Column 12, Line 27: delete "bole" and insert --hole--.

Signed and Sealed this

Twelfth Day of September, 2006

JON W. DUDAS
*Director of the United States Patent and Trademark Office*